United States Patent [19]

Hirao et al.

[11] Patent Number: 5,144,394
[45] Date of Patent: Sep. 1, 1992

[54] SEMICONDUCTOR DEVICE AND METHOD FOR FABRICATING SAME

[75] Inventors: Mitsuru Hirao, Ibaraki; Masataka Minami, Koganei; Shoji Shukuri, Hitachi, all of Japan

[73] Assignee: Hitachi, Ltd., Tokyo, Japan

[21] Appl. No.: 575,581

[22] Filed: Aug. 31, 1990

[30] Foreign Application Priority Data

Sep. 1, 1989 [JP] Japan .................. 1-224444

[51] Int. Cl.$^5$ .............. H01L 29/06; H01L 27/01; H01L 27/12; H01L 29/34
[52] U.S. Cl. ............... 357/23.11; 357/23.1; 357/49; 357/20; 357/54; 357/68
[58] Field of Search ......... 357/23.12, 23.1, 49, 357/20, 34, 68, 43, 54

[56] References Cited

U.S. PATENT DOCUMENTS

| | | | |
|---|---|---|---|
| 3,938,174 | 2/1976 | Sano | 357/23.11 |
| 4,044,452 | 8/1977 | Abbas et al. | 357/23.11 |
| 4,523,213 | 6/1985 | Konaka et al. | 357/23.11 |
| 4,536,782 | 8/1985 | Brown | 357/23.11 |

FOREIGN PATENT DOCUMENTS 62-94985   5/1987 Japan .
62-250671 10/1987 Japan ................... 357/23.11
63-283065 11/1988 Japan .

*Primary Examiner*—Mark V. Prenty
*Attorney, Agent, or Firm*—Antonelli, Terry, Stout & Kraus

[57] ABSTRACT

The structure of a MOSFET and a method for fabricating the same is disclosed, with which it is possible to increase the driving capacity. Heretofore there was a problem that no measures were taken against the decrease in the channel width due to bird's beaks produced at the formation of a field oxide film and that the channel width at the completion of the manufacturing process was smaller than that foreseen during the design of the device. To overcome this problem, a MOSFET is provided in which the junction of the source or the drain is extended up to the end portions in the channel direction so that the effective channel width is determined by the width of the junction on the sides, where the junction is not extended up to the end portions in the channel direction.

12 Claims, 11 Drawing Sheets

FIG. 1
PRIOR ART
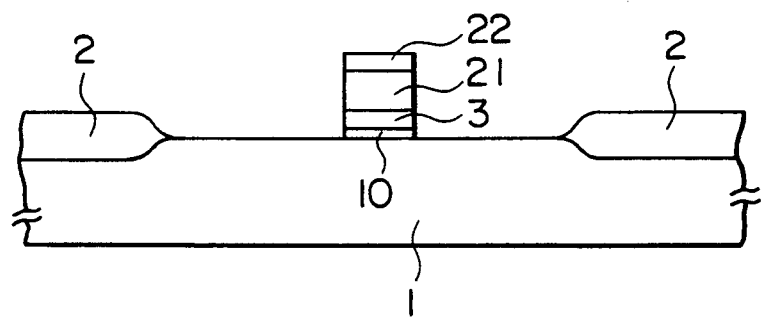
FIG. 1A
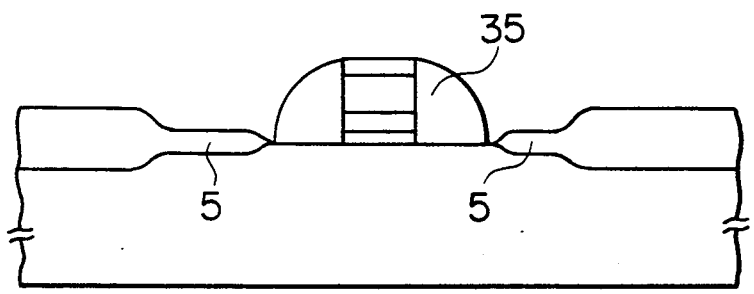
FIG. 1B
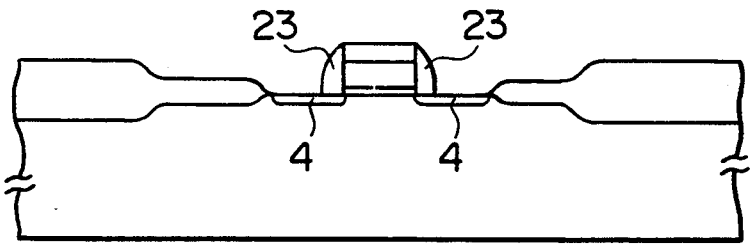
FIG. 1C

SEMICONDUCTOR DEVICE AND METHOD FOR FABRICATING SAME

BACKGROUND OF THE INVENTION

The present invention relates to a semiconductor device and in particular to a semiconductor device having an MOS type structure suitable for dealing with the low supply voltage foreseen at the epoch of deep sub-$\mu$m.

The trial of making semiconductor devices finer and finer is at the epoch of sub-$\mu$m and it is realized that products of level of 0.8 $\mu$m rule are produced in mass. The tendency of making semiconductor devices finer will be advanced further and it is thought to be sure that it is advanced up to a level of 0.1 $\mu$m rule. However, on the other hand, when the trial of making them finer is advanced as described above, the breakdown voltage of MOS transistors of actual structure is lowered, and thus it is not possible to maintain the actual operation with a supply voltage of 5V. Therefore, it has been determined that the lowering in the supply voltage is necessary. Although this lowering in the supply voltage alleviates deteriorations in characteristics due to hot carriers, on the other hand it leads to a lowering of the driving current, and thus the propagation delay time becomes longer. In order to improve it, it is important to increase the driving current of MOS transistors and to decrease the capacitance parasitically added such as the capacitance of wiring, the junction capacitance of the source and the drain of MOS transistors, etc. as far as possible.

A method for decreasing the junction area of the source and the drain to reduce the junction capacitance for achieving such an object is disclosed in JP-A-63-283065, JP-A-62-94985, etc.

Hereinbelow the outline of this method will be explained, referring to FIGS. 1A to 1C. At first, a thick oxide film 2 called field oxide film is formed outside of a region, where an element is to be formed, by the well-known local oxidation (LOCOS) method. Then a gate oxide film 10 is formed in the region, where the element is to be formed, and a gate electrode 3 is formed thereon. In order to give this gate oxide film an anti-oxidation property, an oxide film 21 and an $Si_3N_4$ film 22 are superposed thereon (FIG. 1A). A spacer 35 made of $Si_3N_4$ is formed around this gate electrode and a first field oxide film 5 is formed by using this spacer 35 as a mask (FIG. 1B). By this oxidation the parts acting as the source and the drain are the only parts, which are covered by the spacer ($Si_3N_4$) 35, so that these regions can have an extremely small width of 0.2 to 0.5 $\mu$m. Thereafter the spacer made of $Si_3N_4$ is removed and the new spacer made of $SiO_2$ is formed to make the conventional LDD (Lightly Doped Drain) structure (FIG. 1C).

A feature of this technique consists in that the width of the source and the drain is determined by the width of the spacer 35 made of $Si_3N_4$, which is useful for decreasing the area of the source and the drain, leading, of course, to a decrease in the parasitic capacitance.

However, in the prior art technique, no attention is paid to the increase in the driving current. That is, there was a problem that no measures are taken against the decrease in the channel width due to bird's beaks (intrusion of an oxide film produced at the edge portion of a film of anti-oxidation property) grown in the formation of the field oxide film 2 and that the channel width at the completion is smaller than that foreseen at the design.

SUMMARY OF THE INVENTION

The object of the present invention is to provide a low peripheral capacitance structure of a semiconductor device capable of intending to increase the driving capacity and a method for fabricating same.

A feature of the present invention for achieving the above object is that the field oxide film which is formed at least at the place where the channel region and the element isolation region (field oxide film) are in contact with each other, and at the neighborhood thereof, is thinner than that at other places on the device.

Another feature of the present invention for achieving a similar object is that the junction of the source or the drain is extended up to the end portions in the channel width direction so that the effective channel width is determined on the side, where the junction doesn't extend in the end portions in the channel width direction.

Yet another feature of the present invention is that, in order to realize efficiently the structure described above, a thick field oxide film is formed outside of the region defined by a convex pattern disposed in the region, which is to be the channel, having the anti-oxidation property and the spacer of anti-oxidation property formed around it, and that an oxide film thinner than that of the field oxide film described above is formed in the field portion adjacent to the end portions in the channel width direction at a fabrication step after that (after having removed the spacer of anti-oxidation property described above).

The speed of the growth of the bird's beaks is limited by the diffusion of oxygen atoms in the oxide film. Therefore, it can be thought that the magnitude of the bird's beak introduction is nearly proportional to the thickness of the field oxide film. Consequently it is possible to restrict the growth of the bird's beaks into the channel region, and thus to suppress the decrease in the channel width, by keeping the thickness of the field oxide film at the end portions in the channel width direction at a small value.

Further, in the case where the junction of the source or the drain is extended up to the end portions of the channel, the effective channel width is defined by the smaller width of the channel and it is not influenced by the bird's beak.

Details of the features described above and others of the present invention will be clear from the following description.

BRIEF DESCRIPTION OF THE DRAWINGS

FIGS. 1A to 1C are schemes for explaining a method for fabricating a prior art MOS transistor;

DESCRIPTION OF THE PREFERRED EMBODIMENTS

Embodiment 1

An embodiment of the present invention will be explained, referring to FIGS. 2A to 2C, 3A to 3K, 4A to 4G, 5A and 5B.

Figure 2A:
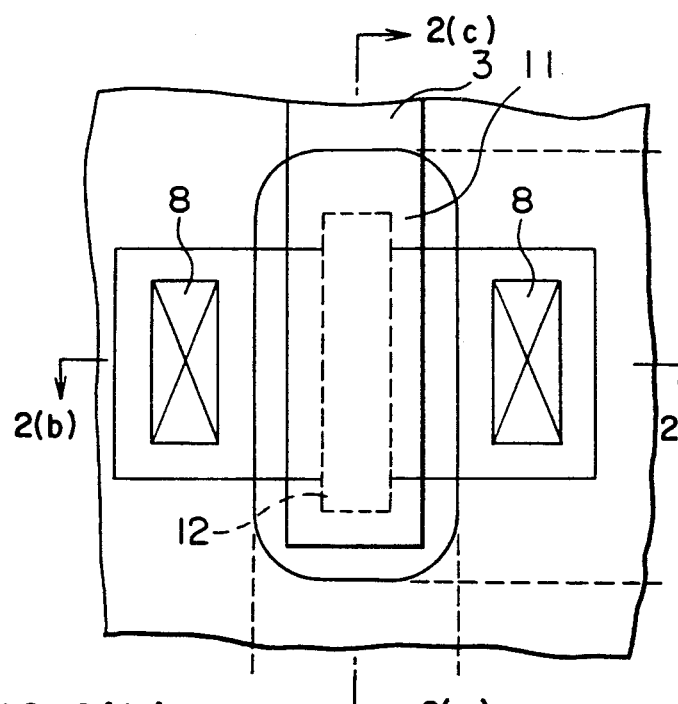
FIG. 2A to 2C show a plan view of the construction of an MOS transistor according to the present invention and cross sectional views along two planes A—A' and B—B' perpendicular to each other.
Figure 2C:
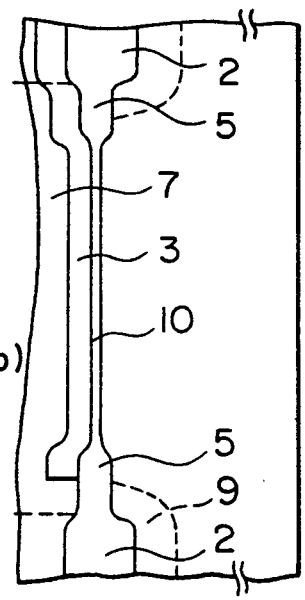
Figure 2B:
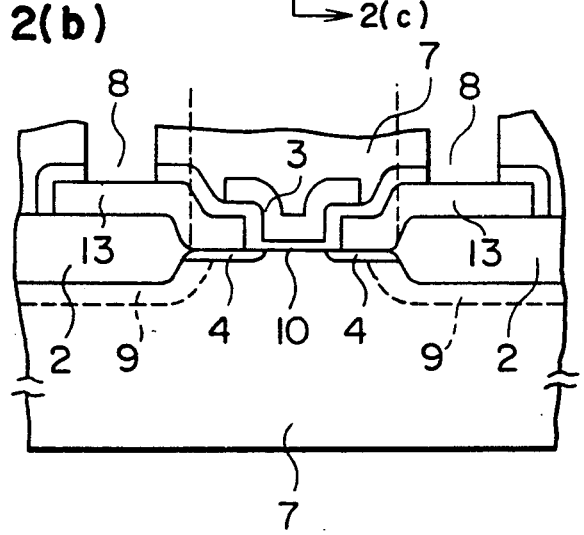
Figure 3A:
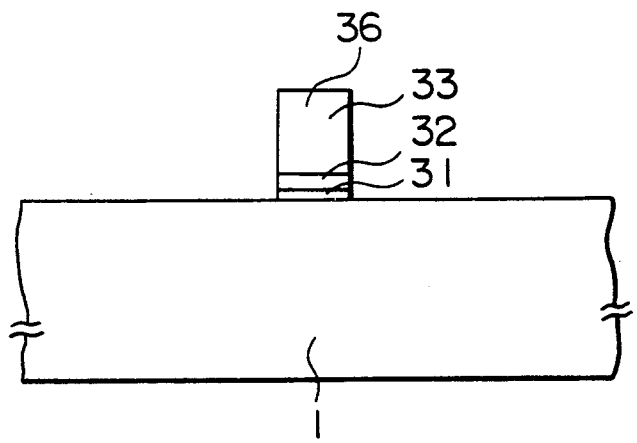
FIGS. 3A to 3K are schemes showing fabrication steps in an embodiment of the present invention viewed from the direction of the cross section along the plane A—A' in FIG. 2.
Figure 3B:
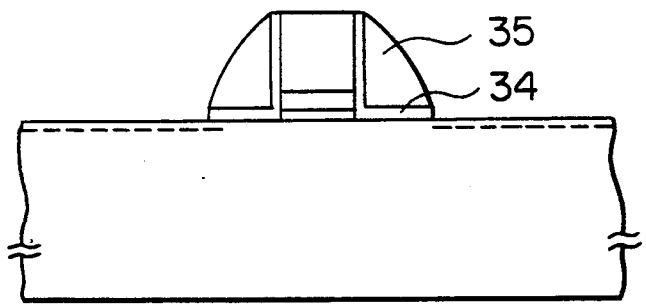
Figure 3C:
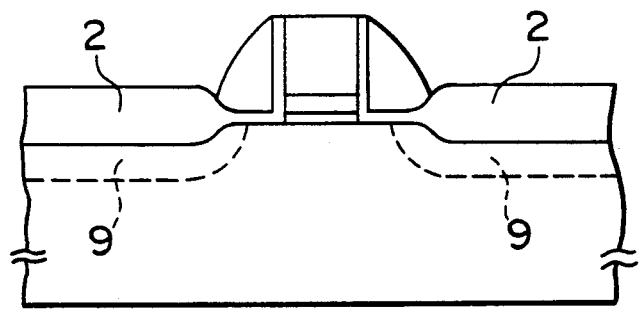

FIGS. 2A to 2C indicate the construction of an MOS transistor in the present embodiment: FIG. 2A being a scheme indicating a plan pattern; FIG. 2B being a cross sectional view along the line A—A' in FIG. 2A and FIG. 2C being a cross sectional view along the line B—B' in FIG. 2A. FIGS. 3A to 3K are schemes showing fabrication steps viewed from the direction of the cross section corresponding to the line A—A' in FIG. 2A; FIGS. 4A to 4G are schemes showing fabrication steps viewed from the direction of the cross section corresponding to the line B—B' in FIG. 2A; FIGS. 5A and 5B are plan views thereof. Although explanation will be made, taking an NMOS as an example, the invention is also valid in the case of a PMOS.

In the embodiment, a first conductivity type semiconductor substrate is a p type semiconductor substrate 1; a second conductivity type region is an n type source/drain 4; a first element isolating film is a first field oxide film (LOCOS film) 2; and a second element isolating film corresponds to a second field oxide film (LOCOS film) 5, the last two films being called together an element isolating film. The element isolating film is an oxide film (or insulating film) outside of the source/drain and the channel region.

As indicated in FIGS. 2A to 2C, the present element is a field effect element in which two regions 4, source and drain, are disposed, distant from each other, and carriers are induced in a channel region 12 therebetween by applying a voltage to a gate electrode 3. A gate oxide film 10 is formed between the gate electrode 3 and the semiconductor substrate so that the element is of so-called MOS structure. In the direction of the cross section along A—A', in the present element region, the extend of the region is defined by the first field oxide film 2 as shown in FIG. 2B. The first field oxide film 2 is formed by the usual LOCOS method. A take-out electrode 13 made of a conductive material such as polycrystalline silicon, etc. is formed from each of the source and the drain 4, which electrode 13 is extended on the first field oxide film 2. Further contact holes 8 are formed over the first field oxide film 2 and the take-out electrodes 13 are connected with wiring therethrough. The gate electrode 3 is disposed on the surface of the semiconductor substrate 1, insulated therefrom by the gate oxide film 10. Further the gate electrode 3 is insulated from the take-out electrode 13 by an oxide film 40. In the plan view the oxide film 40, the take-out electrode 13 and a part of the source or drain are constructed so as to overlap each other.

In the cross section B—B' the structure of the present element is as indicated in FIG. 2C. The channel region is defined in the width direction by the second field oxide film 5 (thinner than the first field oxide film 2), which represents the effective width of the channel region. In the cross section B—B' the field oxide film has 2 steps in the thickness (the first and the second field oxide film) and the gate electrode is formed so as to overlap the second field oxide film 5 at one end thereof. Further the other end of the gate electrode is constructed so as to extend on the second field oxide film 5 and the first field oxide film.

In FIG. 2A the region enclosed by a broken line is the effective channel region 12. Further the second field oxide film 5 is formed on the elliptic active region 11 except for the channel region 12 and the source/drain 4 (region 51 in FIG. 5B stated later). Consequently two sides of the source and the drain 4 are defined by the second field oxide film 5 and the other two sides, which are opposite to the gate electrode 3, are defined by the first field oxide film 2.

According to the structure of the present element, since the width direction sides of the channel region are defined by the thin second field oxide film 5, compared with the case where they are defined by the thick first field oxide film 2, it is possible to prevent the decrease in the channel width due to bird's beaks, etc. and to secure a greater channel width than that obtained heretofore. Further the sides of the source/drain 4, which are opposite to the gate electrode 3, are defined by the first field oxide film 2 and thus, even if the take-out electrodes 13 are formed, the threshold voltage of the parasitic MOS formed by it can be high and also the parasitic capacitance can be small. Furthermore, even if the contact holes are formed to be somewhat deviated, when it is formed over the first field oxide film 2 for the take-out electrode, it gives rise to no problem.

Now the fabrication steps in the present embodiment will be explained.

At first, the whole surface of a p type semiconductor substrate 1 is oxidized to form a thin oxide film 31, 0.01 to 0.05 nm thick. This thin oxide film 31 is formed for the purpose of alleviating stress produced when a first $Si_3N_4$ film 32 is formed thereon and is called a pad oxide film. Next the first $Si_3N_4$ film 32, 0.05 to 0.2 nm thick is formed, superposed thereon and a first CVD oxide film 33, 0.3 to 0.8 nm thick is formed, superposed further thereon. Next these three films are processed by the photolithographic technique to form a remaining protrusion 36 on the wafer (FIG. 3A). The surface portion of the semiconductor substrate, where this protrusion 36 remains, and the neighborhood thereof are a part which will act as the channel in the future, and the remaining protrusion is an important part serving as a reference for the self alignment in the course of succeeding steps. Hereinbelow this remaining protrusion 36 is called dummy gate 36.

A second CVD oxide film 34, 0.05 to 0.1 nm thick is then formed, and, succeedingly, a second $Si_3N_4$ film 35, 0.2 to 0.5 nm thick is formed. When the second $Si_3N_4$ film 35 and the second CVD oxide film 34 are subjected to an anisotropic etching, which proceeds only in the depth direction, the second CVD oxide film 34 and the second $Si_3N_4$ 35 can be left only in the neighborhood of the dummy gate 36, as indicated in FIG. 3B. This is called a spacer. The part covered by the dummy gate 36 and the spacer, as indicated in FIG. 5a, is a part, which will act as the element in the future, and hereinbelow this part is called active region 11.

Next, in order to increase the impurity concentration in the region outside of the active region 11 and to make the isolation between different elements perfect, ions of the same conductivity type as that of the substrate are implanted on the whole surface at a dose of an order of $10^{13}$ to $10^{14}/cm^2$ to form a channel stopper region 9. Then the first field oxide film 2, 0.3 to 0.7 nm thick is formed (FIGS. 3C and 4A). In this case, since the active region 11 is covered by the dummy gate 36 and the spacer 35, it is not necessary to form any new mask for the ion implantation for forming the channel stopper and the field oxidation.

Figure 3D:
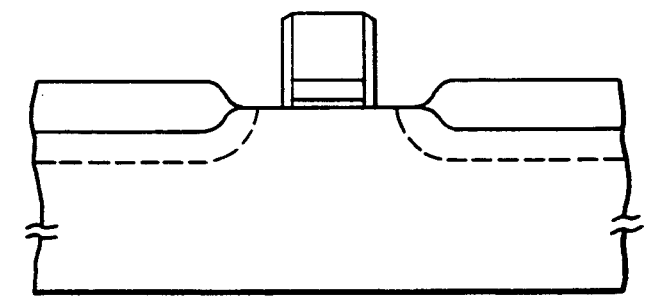
Figure 4A:
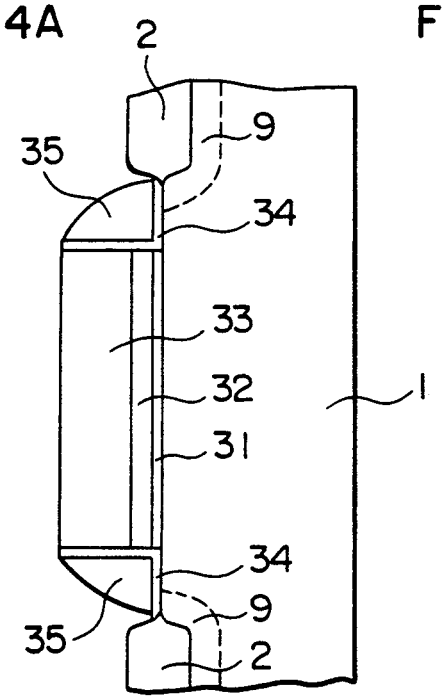
FIGS. 4A to 4G are schemes showing fabrication steps in an embodiment of the present invention viewed from the direction of the cross section along the plane B—B' in FIG. 2.
Figure 4C:
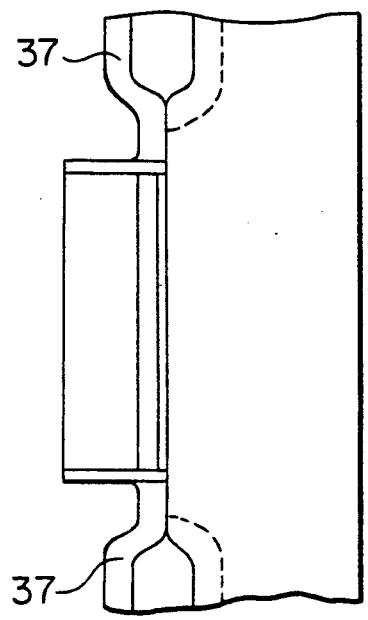
Figure 4B:
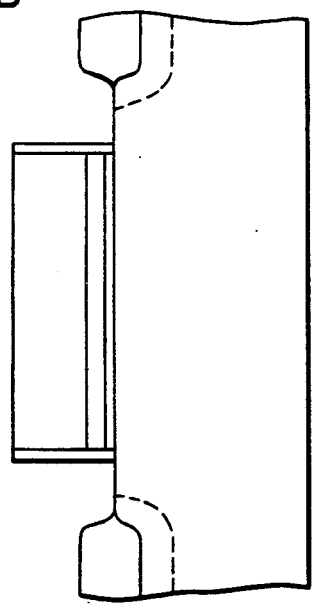
Figure 5A:
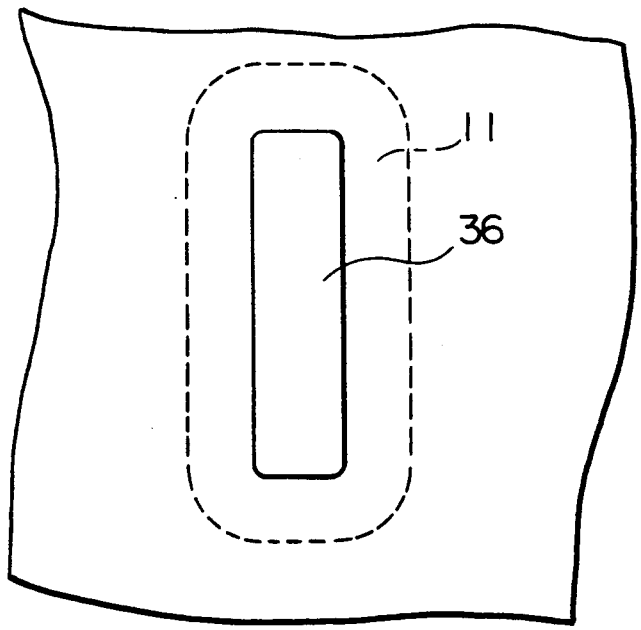
FIGS. 5A and 5B are plan views at two steps in the course of the fabrication of an embodiment of the present invention.
Figure 5B:
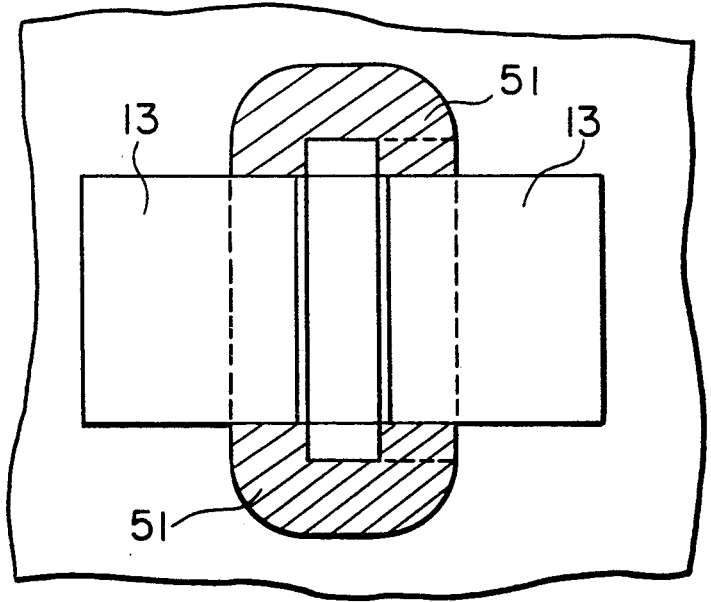

Then, when the $Si_3N_4$ film 35 serving as the spacer is removed and an anisotropic etching is effected for the second CVD oxide film 34, the second CVD oxide film 34 can be left only in the neighborhood of the dummy gate 36 to expose the surface of the semiconductor substrate at the part which was covered by the spacer (FIGS. 3D and 4B).

Figure 3E:
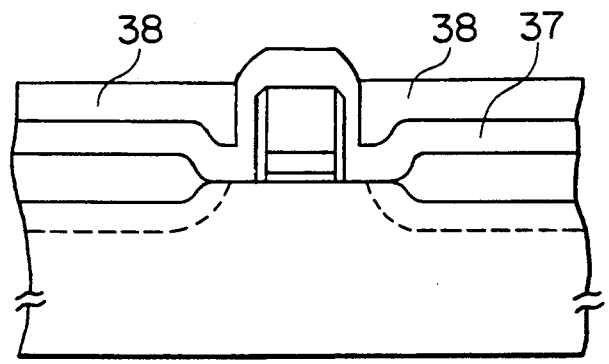

Next a first polycrystalline silicon film 37, which will be the take-out electrodes for the source and the drain, is formed on the whole surface. The part of this first polycrystalline silicon film 37 on the dummy gate 36 should be removed for separating the source and the drain. For this purpose, at first a photosensitive resin layer 38 is applied on the whole surface. Since the photosensitive resin has a high fluidity, it is possible to make the surface thereof almost flat. When the photosensitive resin layer 38 is etched in this state, since the photosensitive resin layer 38 is thin on the dummy pattern, it is possible to expose only the upper portion of the dummy gate and to leave the photosensitive resin layer 38 on the other part (FIG. 3E).

Figure 3F:
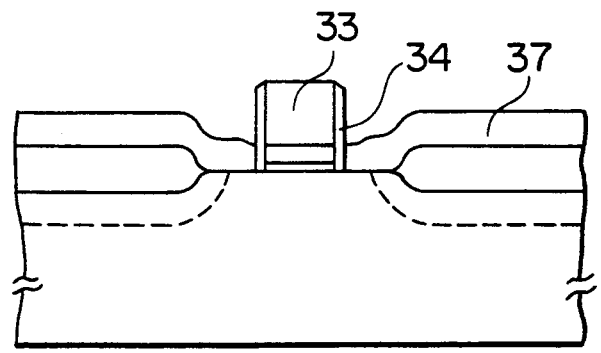

Then, when the exposed first polycrystalline silicon film 37 is etched and the photosensitive layer 38 is removed, the shape indicated in FIGS. 3F and 4C is obtained. FIG. 5A shows a plan view of the element at this point of time. As indicated in the figure, the polycrystalline silicon film 37 is removed on the dummy gate 36, but it remains on the whole surface of the other part. The source and the drain are not yet separated from each other.

Figure 3G:
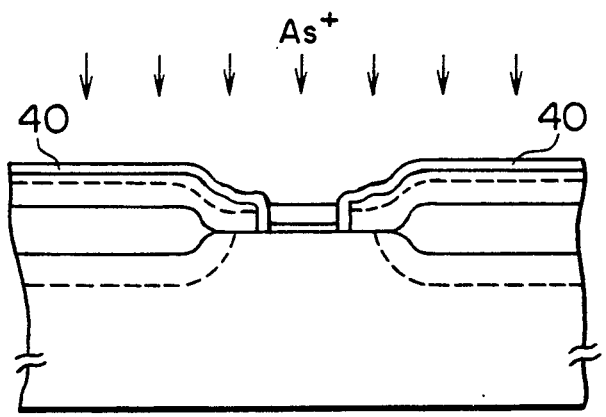
Figure 4D:
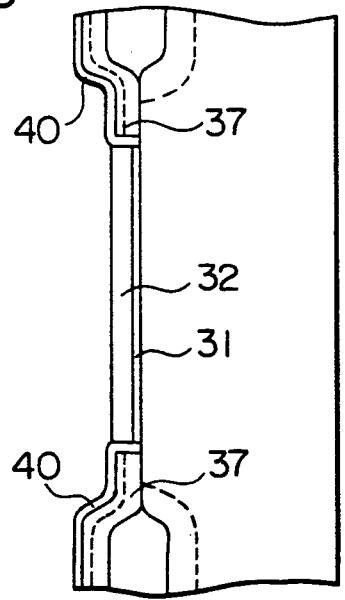

Next the thick first CVD oxide film 33 and the second CVD oxide film 34 are removed. In this way a gap having a same thickness as the second CVD oxide film 34 is formed between the first polycrystalline silicon film 37 and the dummy gate 36 consisting of the remaining first pad oxide film 31 and first $Si_3N_4$ film 32. The polycrystalline silicon film 37 is oxidized in a degree of filling this gap to obtain the oxide film 40. Thus the shape indicated in FIGS. 3G and 4D is obtained. Thereafter, in order to form the junctions of the source and the drain, ions, which are impurities of conductivity type opposite to that of the semiconductor substrate 1, n type impurity As+ in the present embodiment, are implanted in the polycrystalline silicon film (0.1 to $2 \times 10^{16}/cm^2$) so that finally the junctions of the source and the drain are formed by the diffusion therefrom into the semiconductor substrate 1. At this point of time, in the case where the oxide film 40 on the first polycrystalline silicon film 37 is too thick and ions cannot be implanted satisfactorily, the oxide film 40 on the polycrystalline silicon film 37 is removed by the anisotropic etching and a thin oxide film about 0.01 to 0.03 nm thick can be newly formed.

Figure 3H:
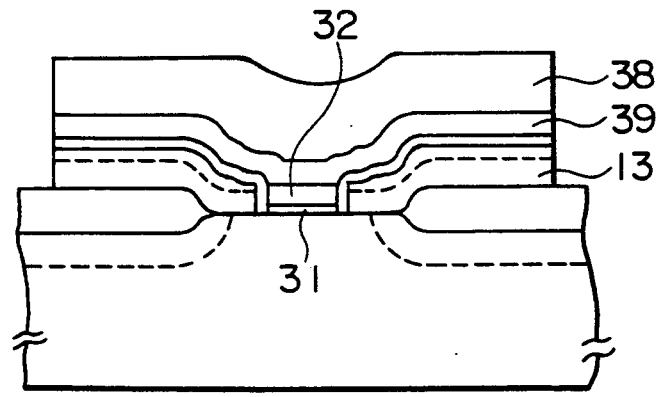
Figure 4E:
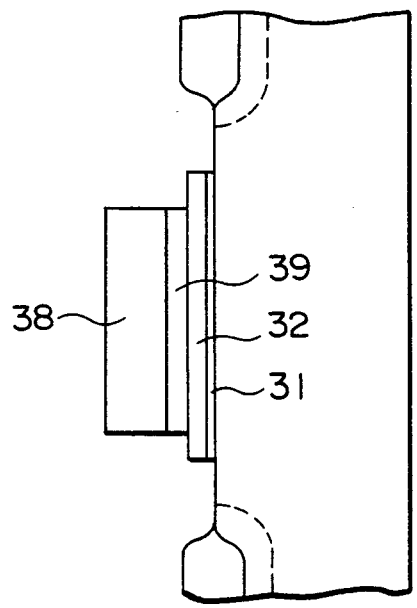

Next a third $Si_3N_4$ film 39 0.05 to 0.1 nm thick is deposited on the whole surface. A photosensitive resin film 38 is formed on the parts, where the take-out electrodes for the source and the drain are to be left, as indicated in FIG. 5B then the polycrystalline silicon film on the other part is removed by etching (FIGS. 3H and 4E). FIG. 5B is a plan view thereof at this point of time. When this fabrication step is terminated, the positions, where the junctions for the source and the drain are formed, are determined, because the junctions for the source and the drain are formed by the diffusion of impurities from the polycrystalline silicon forming take-out electrodes 13.

A point, to which attention should be paid, is that the sides of the take-out electrodes 13 facing to the dummy gate 36 and parallel to the line B—B' in FIG. 2(a) are already self aligned at the step indicated in FIG. 3F, and the channel length is defined by the dummy gate 36.

Then the photosensitive resin film 38 is removed and the exposed surface is oxidized. The main object of this oxidation is to grow the second field oxide film 5 (refer to FIGS. 2(c) and 4F) 0.1 to 0.3 nm thick on the part 51 (refer to FIG. 5B), which is not covered by the take-out electrodes 13 and the dummy gate within the active region 11. This second field oxide film 5 is necessary for effecting perfectly the separation between the source and the drain. However the bird's beaks produced at this oxidation are the main cause of narrowing the channel region and therefore it is desirable that the second field oxide film 5 is as thin as possible, as far as the separation between the source and the drain is possible. Therefore it is thinner than the first field oxide film 2.

Further, in order to make the separation between the source and the drain further perfect, ions, which are impurities having the same conductivity type as that of the substrate, are implanted in the part which is not covered by the dummy gate, and thereafter the second field oxide film 5 is grown thereon. In this way it is possible to increase further the impurity concentration in the surface portion of the substrate, which is more efficient for suppressing the parasitic MOS effect.

Figure 6A:
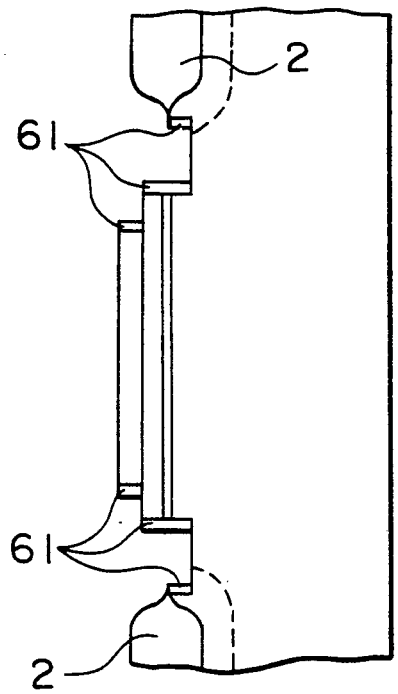
FIGS. 6A and 6B are schemes for explaining a modified example, in which a part of the embodiment is changed.
Figure 6B:
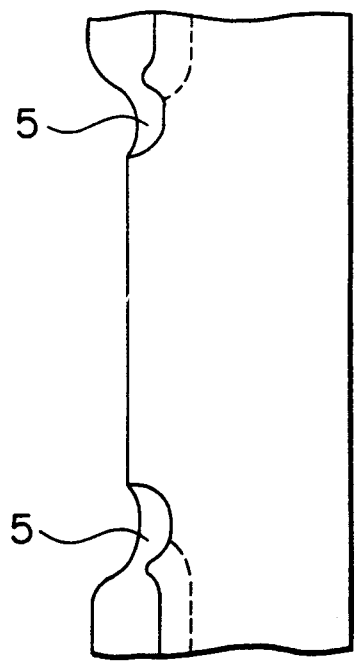

Further, as an example of modification for reducing the decrease in the channel width, it may be possible that before the second field oxidation for growing the second field oxidation film 5, the exposed surface of the semiconductor substrate is etched to a depth of 0.1 to 0.2 nm as indicated in FIG. 6A; the side walls thus produced are covered with an $Si_3N_4$ film 61 by applying the anisotropic etching method described previously; and thereafter the second field oxide film 5 is formed. In this case, the exposed surface of the semiconductor substrate is only the part indicated by reference numeral 51 in FIG. 5B and no new mask is necessary at the etching and the oxidation of the surface of the semiconductor substrate.

Figure 3I:
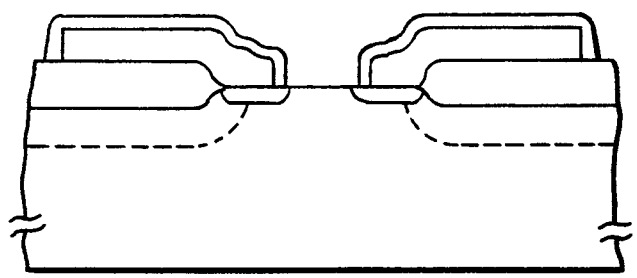
Figure 4G:
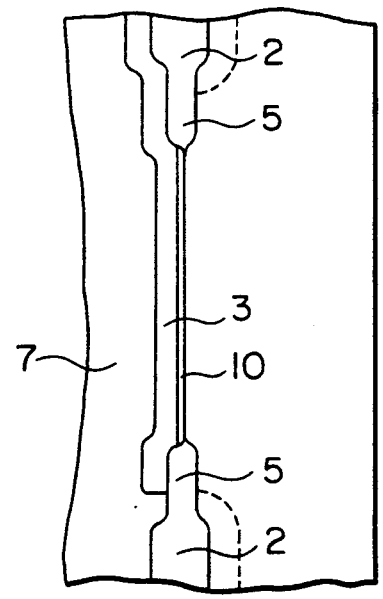
Figure 4F:
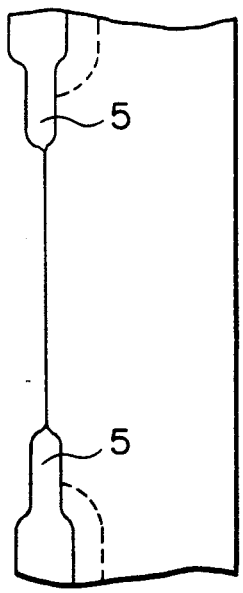

Then, as indicated in FIGS. 3I and 4F, the third $Si_3N_4$ film 39 and the first $Si_3N_4$ film 32 are removed and subsequently the pad oxide film 31 is also removed. At this fabrication step the dummy gate 36 has been removed. That is, the region, which is to be the channel, has been protected by the dummy gate 36 up to the point of time directly before the gate oxidation, which is useful for preventing process damages.

Next the thin gate oxide film 10 having a predetermined thickness (0.005 to 0.002 nm) is formed. Although it is reasonable to effect the channel dope for adjusting the threshold voltage of the MOS transistor after the gate oxidation, it is possible also to effect it before the removal of the pad oxide film 31.

Figure 3J:
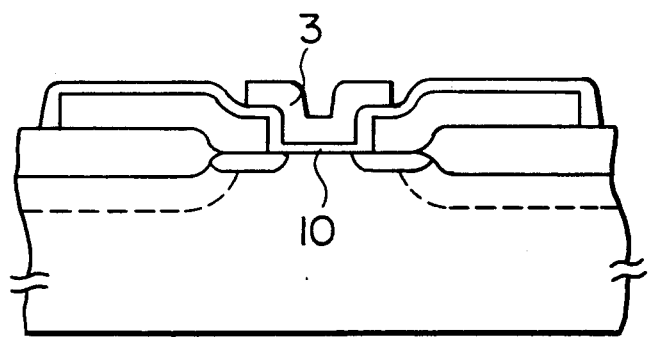

Thereafter a material for making the gate, e.g. polycrystalline silicon, $WSi_2$, multi-layered film of polycrystalline silicon and $WSi_2$, etc. is deposited on the whole surface. Then it is doped with impurities ($As^+$) and processed into the gate electrode 3 (FIG. 3J). At this time, the precision of the processing of the gate electrode is less important than for the case of the prior art technique. This is because all the important factors determining the characteristics of the MOS such as the length and the width of the channel, etc. are defined by the dummy gate 36 formed at the beginning.

Figure 3K:
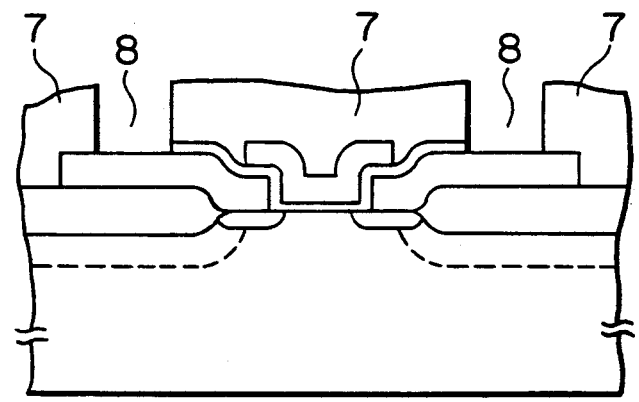

Subsequently the surface passivation film 7 is deposited on the whole surface and contact holes 8 are formed at positions, through which the wiring is taken-out (refer to FIGS. 3K and 4G).

Although thereafter the process proceeds to the formation of the wiring, explanation thereof will be omitted.

In the present embodiment, although it is desirable that the step of forming the second field oxide film 5 is placed, succeeding the step indicated in FIG. 3H, i.e. directly after the formation of the take-out electrodes 13 for the source and the drain, from the point of view that the oxidized region is determined by the self alignment, it is possible also to effect this process at another step. For example, it may be possible also to remove the spacers 34 and 35 at the part corresponding to the reference numeral 51 in FIG. 5B by means of a new mask and by the photolithographic technique after the formation of the first field oxide film 2 (after FIGS. 3C and 4A), and to form the second field oxide film 5 subsequently. In this case, the take-out electrodes 13 for the source and the drain should be formed, superposed necessarily on the second field oxide film 5. This is because, if there were a part where it is not superposed thereon, the surface of the substrate would be etched at processing the take-out electrodes.

The above-mentioned arrangement is effective not only against the decrease in the channel width but also for solving problems in the fabrication the thickness of the second field oxide film 5 at a small value in the neighborhood of the end portions of the channel.

In general, in the case where fine lines are formed on a wafer having a step, the lines are narrower on the protruding portion and wider on the non-protruding portion. In addition to this phenomenon the end portions of the fine lines are apt to be too short even on a flat surface. This phenomenon is more remarkable with the decreasing line width. That is, the lines are narrower with the increasing step of the protruding portion and shorter with the decreasing line width.

The part where this phenomenon has the greatest influences is the end portions of the gate electrode 3. In the prior art, the amount protruding upward of the field oxide film should be sufficiently great at these portions, taking such a phenomenon into account.

By the method according to the present invention, since the field oxide film 5 is thinner at these portions than by the prior art technique, the step is smaller. Therefore, since the decrease in the line width becomes smaller, it is possible to keep the amount protruding upward of the field oxide film 2 or 5 at a small value.

Embodiment 2

Another embodiment of the present invention will be explained, referring to FIG. 7. A feature of the present embodiment is that the part which is to be the channel is as wide as or wider than the size corresponding to the bird's beak produced at the field oxidation.

Figure 7:
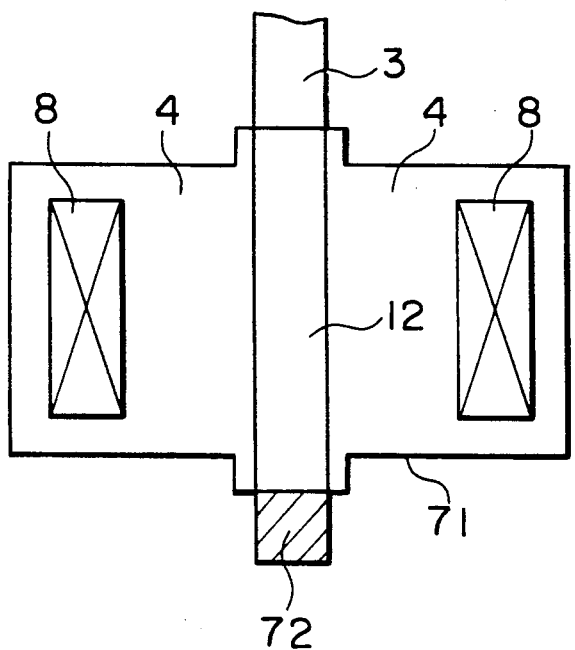
FIG. 7 is a scheme showing a second embodiment of the present invention.

FIG. 7 is a plan view showing the construction of the present embodiment. The field oxide film is formed outside of the boundary 71 thereof. This boundary 71 has a shape, which is wider in the neighborhood of the gate electrode 3 in the direction, along which the gate electrode 3 extends.

The source and the drain 4 are formed so as to put the gate electrode 3 therebetween within the boundary 71. Further the contact holes 8 are formed for taking-out signals to the exterior. The thickness of the field oxide film may have either a single value or two different values so that it is smaller in the neighborhood of the part where the channel is formed. It is preferable that the wider part under the gate electrode is wider than the gate electrode also in the direction of the source and the drain, as indicated in FIG. 7.

Embodiment 3

Figure 8:
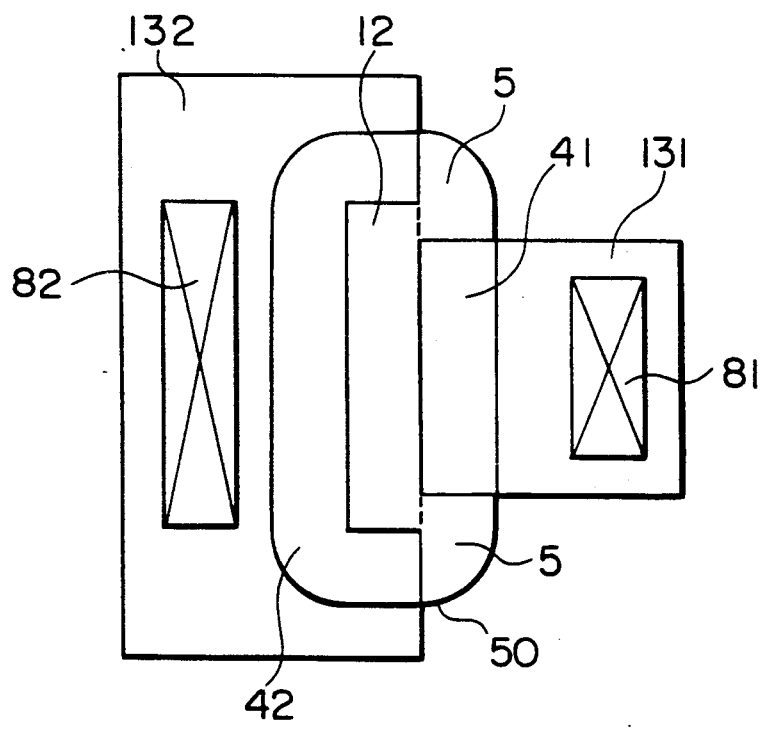
FIG. 8 is a scheme showing a third embodiment of the present invention.

FIG. 8 is a plan view of still another embodiment of the present invention. A feature of this structure is that either one of the source and the drain junction either reaches the end portions of the channel or covers them. By such a structure the effective channel width is almost not influenced by the bird's beak, but it can be determined by the smaller width of the junction.

This structure may be constructed by changing the plan pattern of the mask determining the take-out electrodes 13 for the source and the drain into that indicated by 13 (131 and 132) in FIG. 8, in the fabrication step illustrated in FIG. 3H described in EMBODIMENT 1.

As indicated in FIG. 8, there is a drain region 41 defined by the superposition of the region enclosed by the first take-out electrode 131 and the boundary line 50 indicating the boundary between the first field oxide film and the second filed oxide film 5. There is also a source region 42 defined by the superposition of the region enclosed by the boundary line 50 and the second take-out electrode 132, the source junction being formed so as to enclose the end portions of the channel region 12. In this case, the effective width of the channel region is defined by the drain junction 41.

Further, in this case, the contact hole 82 on the source side can be greater than the contact hole 81 on the drain side. Although, in the example described above, the source is greater than the drain, the drain may be greater than the source.

Thereafter the process proceeds to the formation of the wiring. However this process is omitted in the description.

Embodiment 4

In the present embodiment an example will be explained in which self aligned bipolar transistors and the MOS structure according to the present invention are formed on the same substrate.

As understood from the cross sectional view along the line A—A' in FIG. 2, if the substrate 1 is supposed to be the collector, the source/drain 4 to be the external base, the take-out electrode 13 to be the base take-out electrode, and the gate electrode 3 to be the emitter electrode, this MOS structure is very similar to the structure of a self aligned bipolar transistor. The gate oxide film 10 is an excessive part and the intrinsic base region and the emitter region are parts which should be added. This embodiment will be explained, referring to FIGS. 9A to 9C and 10.

Figure 9A:
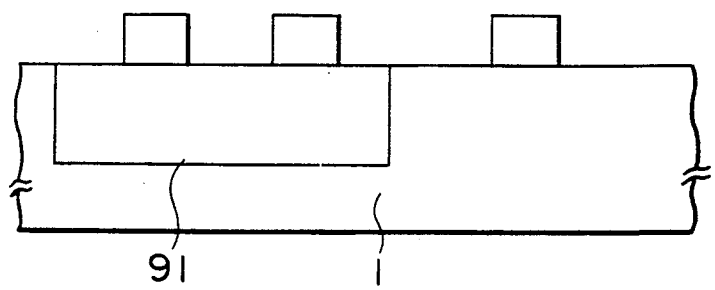
FIGS. 9A to 9C and 10 are cross sectional views at different fabrication steps and a plan view, respectively, in the case where a self-alignment bipolar transistor are formed and an MOS transistor according to the present invention.

In a p type substrate 1 an n type well 91 is formed in a region where a bipolar transistor is to be formed. Dummy gates 36 are formed thereon in the part corresponding to the channel region, the emitter region and the collector electrode (FIG. 9A). In this figure, the internal structure of the dummy gate is omitted. Since the fabrication steps of forming the first field oxide film 2 and removing the spacer 35 and the second CVD film 34 to the fabrication step of forming the polycrystalline silicon film 37 for the take-out electrodes are identical to those indicated in FIGS. 3B to 3E, these figures are omitted.

Figure 9B:
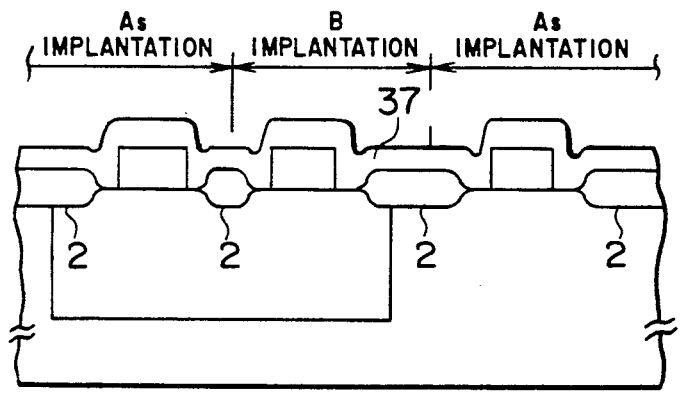
Figure 10:
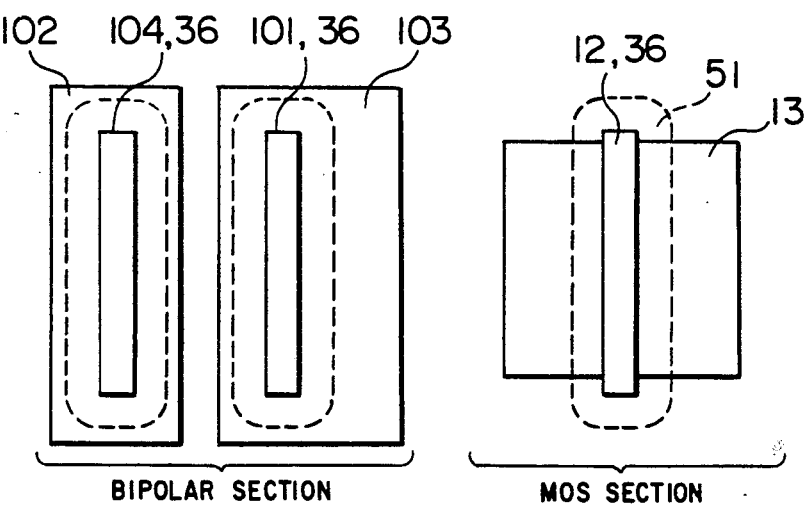

Next boron ions are implanted in the region where the base is to be formed, and arsenic ions are implanted in the source and the drain as well as in the part which should be connected with the collector (FIG. 9B). Subsequently, by the method identical to that described in EMBODIMENT 1, the first polycrystalline silicon film on the dummy gate is removed. Thereafter the take-out electrodes for the source and the drain, the take-out electrode for the base and the take-out electrode for the collector are separated. Up to this step the fabrication steps are identical to those described in EMBODIMENT 1 (steps indicated in FIGS. 3G to 3H). FIG. 10 shows the plan view obtained at this point of time. The bipolar portion is covered by the take-out electrode 103 for the base, the take-out electrode 102 for the collector and the dummy gate 36. Consequently, although the second field oxide film 5 is formed in the part indicated by reference numeral 51 in the succeeding step, in the bipolar portion there is no exposed part of the substrate and this oxide film doesn't grow.

Figure 9C:
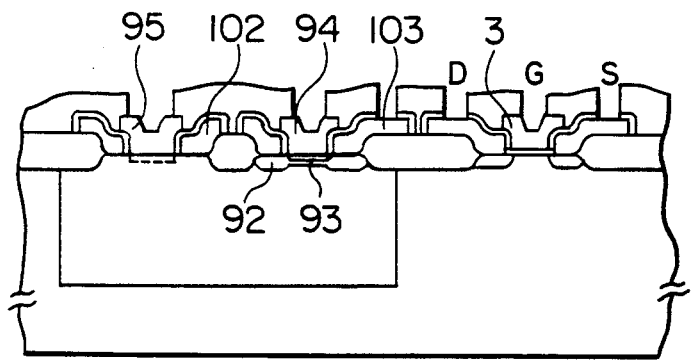

Next the third $Si_3N_4$ film 39 is removed and the remaining portions 31 and 32 of the dummy gate are removed. Then the gate oxidation is effected and the whole surface is subjected to the channel dope. At this time boron ions are implanted in the emitter and the collector portions in the bipolar transistor. However influences of these channel dope boron ions on the bipolar portion are negligibly small. In the case where these boron ions have influences on characteristics of the bipolar transistor, a photolithographic step may be added to cover the bipolar portion with a photosensitive resin film. Thereafter a photosensitive resin film is formed on the whole surface except for the neighborhood of the emitter in the bipolar portion by the photolithography, and boron ions are implanted through an emitter hole for the formation of the intrinsic base. The desired base depth is obtained by annealing. After that, the gate oxide film on the emitter portion 101 and the collector portion 104 is removed, a polycrystalline silicon film, which will be the gate electrode 3 is formed, and As+ions are implanted on the whole surface. The principal part of the element is completed by separating this polycrystalline silicon layer into the gate electrode 3, the emitter electrode 94 and the collector electrode 95. The dose of implanted As+ions should be determined according to the condition for the formation of the emitter in the bipolar transistor. Usually it is 0.5 to $2 \times 10^{16}/cm^2$. FIG. 9C shows the cross sectional shape at the point of time of the formation of the contact holes.

As described above, even in the case where self alignment type bipolar elements are formed mixedly with MOS transistors, an effect can be obtained that common fabrication steps can be intended.

As described above, in the present semiconductor device, since the decrease in the channel region (in particular in the channel width direction) due to bird's beak at the field oxidation can be reduced and also the area of the junctions of the source and the drain can be extremely small, it is possible to obtain a high performance MOS transistor having a small parasitic (junction) capacitance. Further, since the step produced around the channel region can be small and variations in the size at the gate electrode processing are also small, it is possible to increase the fabrication yield.

Further, although the effective channel width is determined by the narrower junction width in the case where the source or drain junction is extended up to the end portions of the channel, since the current path is widened, it is possible to lower the channel resistance and to improve the performance of the MOS transistor.

Still further, by the method according to the present invention, it is possible to integrate high performance MOS transistors and high performance self-aligned bipolar transistors on a same chip only by adding 2 masks for removing the oxide film on the emitter portion and for ion implantation to form the intrinsic base, thereby improving the performance of a Bi-CMOS LSI in a simple manner.

According to the present invention, since the decrease in the channel width can be reduced, it is possible to provide a structure of a semiconductor device and a method for fabricating same, by which increase in the driving capacity can be achieved compared with prior art techniques.

What is claimed is:

1. A semiconductor device comprising:
    a gate electrode formed on a gate insulating film which in turn is formed on an active region, enclosed by a first element isolating film, which active region is formed in a major surface of a semiconductor substrate having a first conductivity type; and
    regions having a second conductivity type, which are separated by a channel region under said gate electrode in which a channel is induced,
    wherein said second conductivity type regions are defined by said first element isolating film at the sides opposite to said gate electrode, and
    wherein at least a part of said channel region in said active region is enclosed by a second element isolating film which is thinner than said first element isolating film, and wherein said first and second element isolating films are both formed on said major surface of said semiconductor substrate.

2. A semiconductor device according to claim 1, wherein end portions of said channel region in the channel width direction in said active region are enclosed by said second element isolating film.

3. A semiconductor device according to claim 1, wherein said second conductivity type regions form source and drain regions of the semiconductor device.

4. A semiconductor device comprising:
    a gate electrode formed on a gate insulating film which in turn is formed on an active region enclosed by an element isolating film in a semiconductor substrate having a first conductivity type; and a source and a drain region having a second conductivity type, wherein are separated by a channel region under said gate electrode, in which a channel is induced, wherein said active region has a width, at least under said gate electrode, which is greater than a width of said second conductivity type region in the gate width direction, and further wherein said element isolating film includes a first portion enclosing areas of said active region that do not extend beyond the width of said second conductivity type region in the gate width direction and a second portion, which is thinner than the first portion, which encloses areas of said active region that do not extend beyond the width of said second conductivity type region in the gate width direction.

5. A semiconductor device comprising:

a gate electrode formed on an insulating film which in turn is formed on a channel region in an active region enclosed by an element isolating film on a main surface of a semiconductor substrate having a first conductivity type wherein said element isolating film comprises first and second field oxide films formed on said main surface of said semiconductor substrate, wherein the second field oxide film is in contact with the channel region and is thinner than said first field oxide film; and second conductivity type regions disposed on opposite sides of said channel region, wherein a bottom face of said second field oxide film is formed so as to be deeper in a neighborhood where said second field oxide film is in contact with the channel region 6. A semiconductor device comprising:

gate electrode formed on a gate insulating film which in turn is formed on an active region enclosed by an element isolating film in a semiconductor substrate having a first conductivity type; and source and drain regions having a second conductivity type, which are separated by a channel region under said gate electrode in which a channel is induced, wherein at least one of said source and drain regions is extended in a region which is in contact with an end portion of said channel region in the gate width direction.

7. A semiconductor device according to claim 1, further comprising a bipolar transistor including an emitter region, a base region and a collector region, wherein an emitter electrode connected with said emitter region is at least partially surrounded by a base electrode connected with said base region.

8. A semiconductor device according to claim 5, further comprising a bipolar transistor including an emitter region, a base region and a collector region, wherein an emitter electrode connected with said emitter region is at least partially surrounded by a base electrode connected with said base region.

9. A semiconductor device fabricated by forming an insulating film having an anti-oxidation property on a predetermined portion of a semiconductor substrate; forming a spacer having an anti-oxidation property around said insulating film; forming a first field oxide film by using said insulating film and said spacer as a mask; removing said spacer to expose a portion of the surface of the substrate other than the predetermined portion; forming a semiconductor film over substantially the whole upper surface of the semiconductor device including said exposed portion of said substrate; forming take-out electrodes from said semiconductor film in contact with said exposed surface of said substrate and disposed on opposite sides of said insulating film; forming a second field oxide film at a region which is defined by said first field oxide and by said insulating film and by said take-out electrode; forming a source and a drain being connected with said take-out electrodes and having an opposite conductivity type than the substrate; forming a gate insulating film at a channel region which is defined by said take-out electrodes and by said second field oxide film; and forming a gate electrode in contact with said second field oxide film which is thinner than said first field oxide film.

10. A semiconductor device according to claim 4, wherein said active region is formed in a major surface of said semiconductor substrate, and wherein said first and second portions of said element isolating film are both formed on said major surface of said semiconductor substrate.

11. A semiconductor device according to claim 7, wherein said base electrode completely surrounds said emitter electrode.

12. A semiconductor device according to claim 8, wherein said base electrode completely surrounds said emitter electrode.

* * * * *